(12) United States Patent
Han

(10) Patent No.: US 7,727,807 B2
(45) Date of Patent: Jun. 1, 2010

(54) SEMICONDUCTOR DEVICE

(75) Inventor: Jae-Won Han, Gyeongi-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 176 days.

(21) Appl. No.: 11/831,539

(22) Filed: Jul. 31, 2007

(65) Prior Publication Data

US 2008/0036064 A1 Feb. 14, 2008

(30) Foreign Application Priority Data

Aug. 11, 2006 (KR) ...................... 10-2006-0076190

(51) Int. Cl.
*H01L 21/70* (2006.01)
(52) U.S. Cl. ................... 438/109; 257/E25.027
(58) Field of Classification Search ................. 257/686, 257/706, 712, 777, E25.027; 438/109
See application file for complete search history.

(56) References Cited

U.S. PATENT DOCUMENTS

| | | | |
|---|---|---|---|
| 4,671,080 A | 6/1987 | Gross | |
| 5,682,062 A | 10/1997 | Gaul | |
| 5,883,426 A | 3/1999 | Tokuno et al. | |
| 6,219,237 B1 | 4/2001 | Geusic et al. | |
| 6,285,550 B1 | 9/2001 | Belady | |
| 6,496,370 B2 | 12/2002 | Geusic | |
| 6,577,013 B1 | 6/2003 | Glenn et al. | |
| 6,607,938 B2 | 8/2003 | Kwon et al. | |
| 6,942,018 B2 | 9/2005 | Goodson et al. | |
| 7,353,859 B2 * | 4/2008 | Stevanovic et al. | 165/80.4 |
| 2005/0085018 A1 | 4/2005 | Kim | |
| 2005/0128702 A1 * | 6/2005 | Mongia et al. | 361/688 |
| 2005/0280160 A1 | 12/2005 | Kim et al. | |
| 2006/0286822 A1 * | 12/2006 | Thomas et al. | 439/55 |

FOREIGN PATENT DOCUMENTS

CN 1347140 5/2002

* cited by examiner

*Primary Examiner*—Nathan W Ha
(74) *Attorney, Agent, or Firm*—Sherr & Vaughn, PLLC

(57) ABSTRACT

A semiconductor device according to embodiments may include an interposer, a plurality of devices stacked on the interposer, a cooling device provided in at least one of the devices and including a passage for a cooling material, and a connection electrode provided between the devices, in which the connection electrode connects a signal electrode in an upper device to a signal electrode in a lower device.

6 Claims, 5 Drawing Sheets

SEMICONDUCTOR DEVICE

The present application claims priority under 35 U.S.C. 119 and 35 U.S.C. 365 to Korean Patent Application No. 10-2006-0076190 (filed on Aug. 11, 2006), which is hereby incorporated by reference in its entirety.

BACKGROUND

FIG. 1 is a drawing illustrating a semiconductor device in the form of a "system in a package" (SiP) obtained through a related art semiconductor manufacturing method.

Referring to FIG. 1, a related art SiP semiconductor device may include interposer 11, first device 13, second device 15, and third device 17.

First device 13, second device 15, or third device 17 may include any one of a central processing unit (CPU), a static random access memory (SRAM), a dynamic random access memory (DRAM), a flash memory, a logic large scale integrated circuit (LSI), a power integrated circuit (IC), a control integrated circuit (IC), an analog large scale integrated circuit (LSI), a microwave monolithic integrated circuit (MM IC), a complementary metal-oxide semiconductor radio-frequency integrated circuit (CMOS RF-IC), a sensor chip, a micro-electro-mechanical systems (MEMS) chip, etc.

Connection units may be formed between first and second devices 13 and 15, and between second and third devices 15 and 17, and may transfer signals to each device.

However, to extensively use the SiP semiconductor device having the above structure, a problem regarding heat dissipation may need to be solved. Particularly, the problem regarding heat dissipation of a device, such as second device 15 positioned in a mid-layer, may need to be solved to extensively use the SiP semiconductor device.

SUMMARY

Embodiments relate to a semiconductor device and a method for manufacturing the same. In embodiments a semiconductor device and a method for manufacturing the same may be capable of easily dissipating heat from an SiP semiconductor device.

According to embodiments, a semiconductor device may include an interposer, a plurality of devices stacked on the interposer, a cooling device provided in at least one of the devices and including a passage for a cooling material, and a connection electrode provided between the devices, in which the connection electrode connects a signal electrode in an upper device to a signal electrode in a lower device.

In embodiments, a method for manufacturing a semiconductor device may include forming a plurality of devices such that at least one device may include a cooling device having a passage for a cooling material, and stacking the devices on an interposer.

DRAWINGS

DETAILED DESCRIPTION

Figure 1:
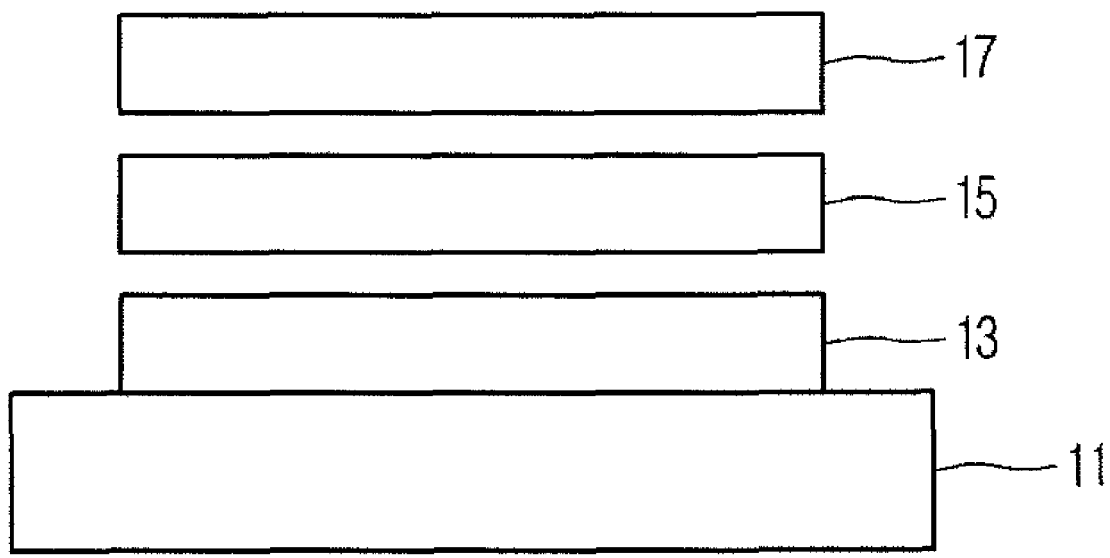
FIG. 1 is a drawing illustrating a related SiP semiconductor device obtained through a related semiconductor device manufacturing method.
Figure 2:
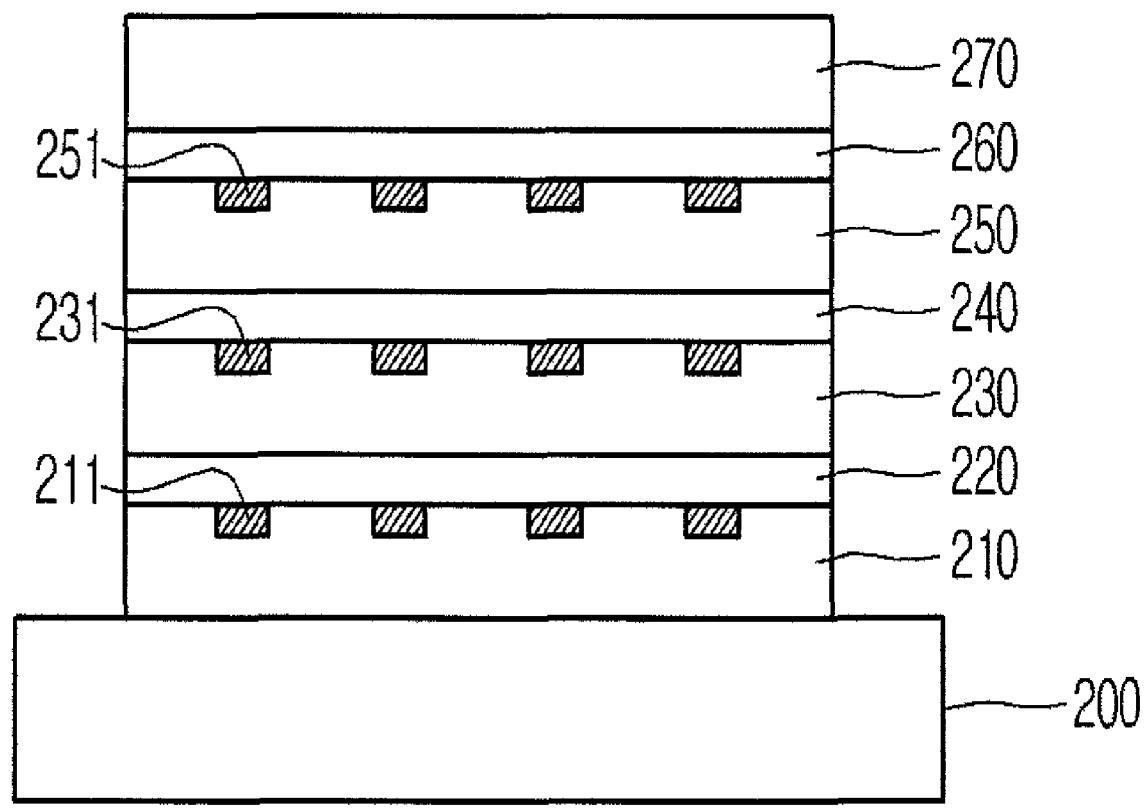
FIG. 2 is a drawing illustrating an SiP semiconductor device obtained through a method of manufacturing a semiconductor device according to embodiments.
Figure 3:
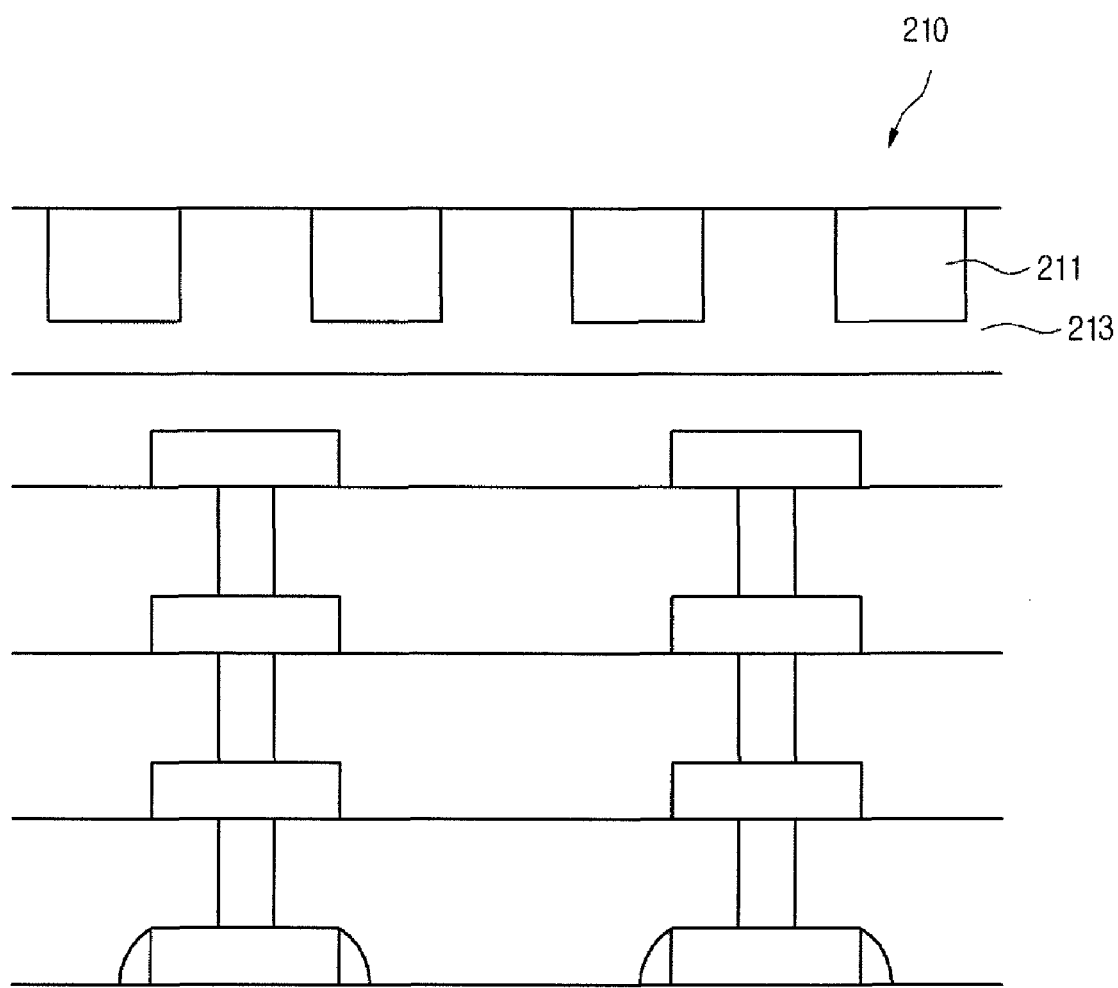
FIG. 3 is a drawing illustrating the structure of a device provided with a passage for a cooling material in a semiconductor device according to embodiments.
Figure 4:
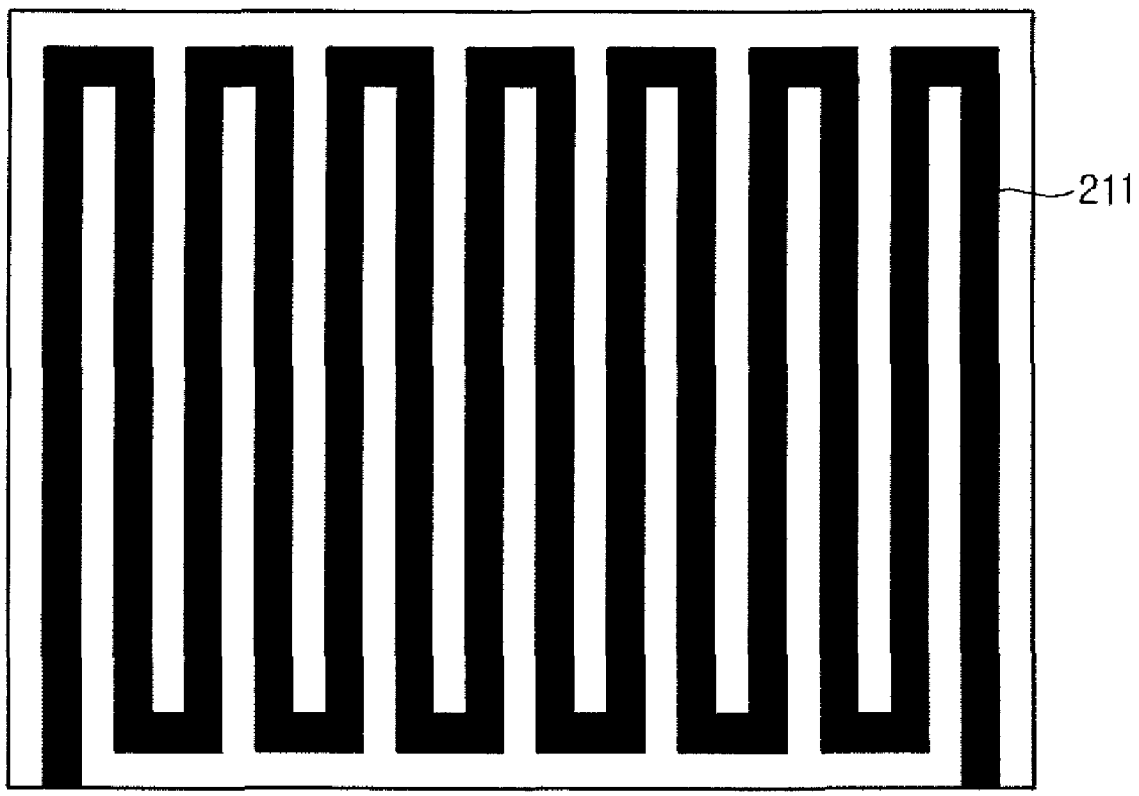
FIG. 4 is a drawing illustrating a protection layer formed with a passage for a cooling material in a semiconductor device according to embodiments.

Referring to FIGS. 2 to 4, a semiconductor device according to embodiments may include interposer 200, first device 210, second device 230, third device 250, and fourth device 270. First to third devices 210, 230, and 250 may be provided with first, second, and third passages 211, 231, and 251 that may be provided to move a cooling material.

The semiconductor device according to embodiments may include first connection layer 220 that may connect a signal electrode formed in first device 210 with a signal electrode formed in second device 230. In addition, the semiconductor device may include second connection layer 240 that may connect the signal electrode formed in second device 230 with a signal electrode formed in third device 250. The semiconductor device may include third connection layer 260 that may connect the signal electrode formed in third device 250 with a signal electrode formed in fourth device 270.

First device 210 may include a cooling device having first passage 211. The cooling device may be provided in protection layer 213 formed in an upper portion of first device 210. Generally, since protection layer 213 may be formed in the upper-most portion of a device, first passage 211 for moving the cooling material may be easily formed through etching and cleaning processes for protection layer 213. In addition, the cooling device may be provided in various positions instead of the upper-most portion of first device 210.

FIG. 2 illustrates second and third passages 231 and 251 that may be configured to move a cooling material formed in second and third devices 230 and 250. However, even if the passage for the cooling material were formed in at least one device, all of the heat of the semiconductor device may be dissipated. In embodiments, although not illustrated, a passage for the cooling material may be formed in fourth device 270 positioned in an upper-most portion of the semiconductor device shown in FIG. 2.

The semiconductor device according to embodiments further may include a cooling material supplier connected to the cooling device that may supply the cooling material. The cooling material supplied from the cooling material supplier may pass through passages 211, 231, and 251 formed in the first to third devices 210, 230, and 250. In embodiments, although not illustrated, cooling material supplied from the cooling material supplier may pass through a passage that may be formed in fourth device 270. The cooling material may include low-temperature gas and low-temperature liquid such as liquid nitrogen. Accordingly, the semiconductor device according to embodiments may easily and efficiently dissipate heat to an exterior.

In embodiments, first to fourth devices 210, 230, 250, and 270 may each include a through electrode that may pass through the respective devices. The through electrode may deliver signals between a lower device and an upper device.

Although the SiP semiconductor device having stacked first to fourth devices 210, 230, 250, and 270 is described in the above description, the number of the stacked devices may be variously changed. Each device may include one of a central processing unit (CPU), a static random access memory (SRAM), a dynamic random access memory (DRAM), a flash memory, a logic large scale integrated circuit (LSI), a power integrated circuit (IC), a control integrated circuit (IC), an analog large scale integrated circuit (LSI), a microwave monolithic integrated circuit (MM IC), a complementary metal-oxide semiconductor radio-frequency integrated circuit (CMOS RF-IC), a sensor chip, and a micro-electro-mechanical systems (MEMS) chip.

In a method for manufacturing the semiconductor device according to embodiments, a plurality of devices may be formed such that at least one device may include a cooling device having a passage for a cooling material. In a method for manufacturing a semiconductor device according to embodiments, the devices may be stacked on the interposer. Connection layers may be formed between the devices. Signal electrodes formed in the upper and lower devices may be connected to each other through the connection electrode formed in the connection layer.

According to embodiments, when the devices are formed, the cooling device may be formed in the protection layer positioned in an upper-most portion of the device equipped with the cooling device.

FIG. 4 is a drawing illustrating a protection layer formed with a passage for a cooling material in a semiconductor device according to embodiments. In embodiments, passage 211 may be formed in a winding pattern and may cover much surface area.

Figure 5:
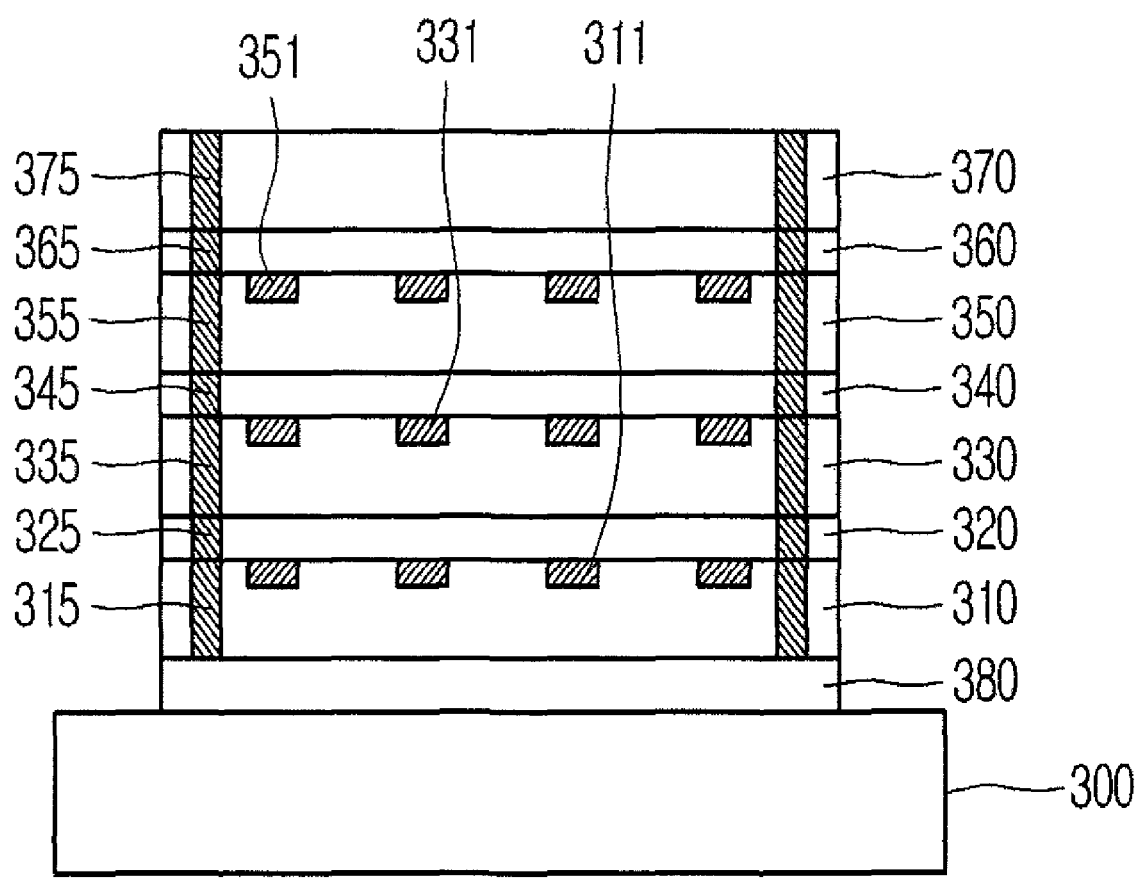
FIG. 5 is a drawing illustrating an SiP semiconductor device obtained through a method for manufacturing a semiconductor device according to embodiments.

In embodiments, to more efficiently dissipate heat from each device, a semiconductor device having the structure illustrated in FIG. 5 may be manufactured. FIG. 5 is a drawing illustrating an SiP semiconductor device obtained through a method for manufacturing a semiconductor device according to embodiments.

Referring to FIG. 5, the SiP semiconductor device may include interposer 300, first device 310, second device 330, third device 350, and fourth device 370. The SiP semiconductor device may include first through electrode 315 that may pass through first device 310, second through electrode 335 that may pass through second device 330, third through electrode 355 that may pass through third device 350, and fourth through electrode 375 that may pass through fourth device 370. First to third devices 310, 330, and 350 may include passages 311, 331, and 351 that may be configured to move a cooling material.

The SiP semiconductor device may include first connection layer 320 that may connect a signal electrode formed in first device 310 to a signal electrode formed in second device 330. The SiP semiconductor device may include second connection layer 340 that may connect the signal electrode formed in second device 330 to a signal electrode formed in third device 350. The SiP semiconductor device may include third connection layer 360 that may connect the signal electrode formed in third device 350 to a signal electrode formed in fourth device 370.

First device 310 may include a cooling device having passage 311 that may be configured to move a cooling material. The cooling device may be provided in a protection layer formed in an upper portion of first device 310. In embodiments, since the protection layer may be formed in the upper-most portion of a device, passage 311 that may move the cooling material may be easily formed through an etching and cleaning processes for the protection layer. In embodiments, the cooling device may be provided in various positions instead of the upper-most portion of first device 310.

FIG. 5 illustrates passages 331 and 351 that may be configured to move a cooling materials formed in second and third devices 330 and 350. However, even if the passage for the cooling material is formed in at least one device, most or all of the heat of the semiconductor device may be dissipated. In embodiments, the passage for the cooling material may be formed even in fourth device 370 positioned in the upper-most portion of the semiconductor device shown in FIG. 5.

The SiP semiconductor device according to embodiments may further include a cooling material supplier connected to the cooling device that may supply the cooling material. The cooling material supplied from the cooling material supplier may pass through passages 311, 331, and 351 formed in the corresponding devices to move the cooling material. The cooling material may include low-temperature gas and low-temperature liquid such as liquid nitrogen. Accordingly, the SiP semiconductor device according to embodiments may easily and efficiently dissipate heat to an exterior.

The SiP semiconductor device may include first connection layer 320 to connect first device 310 to second device 330. The SiP semiconductor device may include second connection layer 340 to connect second device 330 to third device 350. The SiP semiconductor device may include third connection layer 360 to connect third device 350 to fourth device 370. First to third connection electrode 325, 345, and 365 may be formed in the first to third connection layer 320, 340, and 360.

In embodiments, first device 310 may be electrically connected with second device 330 by the first connection electrode 325. In embodiments, second device 330 may be electrically connected with third device 350 by the second connection electrode 345. In embodiments, third device 350 may be electrically connected with fourth device 370 by third connection electrode 365.

In embodiments, first connection electrode 325 may connect first through electrode 315 with second through electrode 335. In embodiments, second connection electrode 345 may connect second through electrode 335 with third through electrode 355. In embodiments, third connection electrode 365 may connect third through electrode 355 with fourth through electrode 375.

Through electrodes 315, 335, 355, and 375 may be formed by sequentially performing a pattern process, an etching process, a metal forming process for the semiconductor device, and a chemical mechanical polishing (CMP) process. Since the processes may be well-known, a description thereof will be omitted.

In embodiments, through electrodes 315, 335, 355, and 375 may include at least one of tungsten (W), copper (Cu), aluminum (Al), silver (Ag), and gold (Au). The through electrode may be deposited through physical vapor deposition (PVD), atomic layer deposition (ALD), chemical vapor deposition (CVD), evaporation, or electro-chemical plating (ECP). A barrier of the through electrode may include one selected from the group consisting of TaN, Ta, TiN, Ti, and TiSiN, and may be formed through the CVD, the PVD, or the ALD.

In embodiments, heat dissipating device 380 may be formed below a bottom surface of first device 310. Heat dissipation device 380 may be connected to the devices through the through electrodes to more efficiently dissipate heat from the devices. Heat dissipating device 380 may include a heat sink or a heat pipe.

According to embodiments, in the semiconductor device and a method for manufacturing the same, heat may be easily dissipated from a SiP semiconductor device.

It will be apparent to those skilled in the art that various modifications and variations can be made to embodiments. Thus, it is intended that embodiments cover modifications and variations thereof within the scope of the appended claims. It is also understood that when a layer is referred to as being "on" or "over" another layer or substrate, it can be directly on the other layer or substrate, or intervening layers may also be present.

What is claimed is:

1. A method, comprising:
   forming a plurality of devices, at least one device comprising a cooling device having a passage for a cooling material; and
   stacking the plurality of devices over an interposer,
   wherein said stacking the plurality of devices comprises:
      forming signal electrodes in each of the plurality of devices;

forming a connection layer between each of the plurality of devices;

forming a connection electrode in each connection layer; and connecting signal electrodes formed in upper and lower devices to each other through the connection electrode provided in the connection layer between the upper and lower devices.

2. The method of claim 1, wherein forming the at least one device having the cooling device comprises:

forming a protection layer in an upper-most portion of the at least one device equipped with the cooling device; and forming the cooling device in the protection layer.

3. The method of claim 1, wherein forming the plurality of devices comprises forming through electrodes in each of the plurality of devices, the through electrodes passing through the respective devices.

4. The method of claim 3, wherein each through electrode comprises at least one of tungsten (W), copper (Cu), aluminum (Al), silver (Ag), and gold (Au).

5. The method of claim 1, wherein the cooling material comprises at least one of a low-temperature gas and a low-temperature liquid.

6. The method of claim 1, wherein each device comprises one of a central processing unit (CPU), a static random access memory (SRAM), a dynamic random access memory (DRAM), a flash memory, a logic large scale integrated circuit (LSI), a power integrated circuit (IC), a control integrated circuit (IC), an analog large scale integrated circuit (LSI), a microwave monolithic integrated circuit (MM IC), a complementary metal-oxide semiconductor radio-frequency integrated circuit (CMOS RE-IC), a sensor chip, and a micro-electro-mechanical systems (MEMS) chip.

* * * * *